United States Patent [19]

Ueno

[11] Patent Number: 5,059,824

[45] Date of Patent: Oct. 22, 1991

[54] BICMOS OUTPUT CIRCUIT WITH STATIC OUTPUT CURRENT CONTROL CIRCUIT

[75] Inventor: Masaji Ueno, Tokyo, Japan

[73] Assignee: Kabushiki Kaisha Toshiba, Kawasaki, Japan

[21] Appl. No.: 579,668

[22] Filed: Sep. 10, 1990

[30] Foreign Application Priority Data

Sep. 13, 1989 [JP] Japan .................... 1-235775

[51] Int. Cl.$^5$ .................... H03K 19/02; H03K 5/12
[52] U.S. Cl. .................... 307/446; 307/475; 307/570; 307/263; 307/547; 307/548
[58] Field of Search ............... 307/448, 451, 446, 475, 307/570, 263, 546-548

[56] References Cited

U.S. PATENT DOCUMENTS

| 4,871,928 | 10/1989 | Bushey | 307/570 |
| 4,897,564 | 1/1990 | Chen | 307/570 |
| 4,970,414 | 11/1990 | Ruth, Jr. | 307/570 |

FOREIGN PATENT DOCUMENTS 0134731  3/1985  Japan .................... 307/446

Primary Examiner—Stanley D. Miller
Assistant Examiner—Margaret Rose Wambach
Attorney, Agent, or Firm—Finnegan, Henderson, Farabow, Garrett, and Dunner

[57] ABSTRACT

In an output circuit having pull down and pull up npn transistors, a static output-current control circuit is provided. The control circuit is turned on by detecting that a potential at the output terminal of the circuit is at a predetermined value of less. When the input signal supplied to the input terminal goes from CMOS level "0" to CMOS level "1" to change the voltage at the output terminal from TTL level "1" to TTL level "0", and when the potential at the output terminal becomes a predetermined value or less, the static output-current control circuit is turned on. A base current is supplied from the static output-current control circuit to the pull down npn transistor. As a result, the static output current is not decreased but kept constant. To the contrary, when the input signal goes from CMOS level "1" to MOS level "0" to change the voltage at the output terminal from TTL level "0" to TTL level "1", and the potential at the output terminal is a predetermined value or more, the output current-control circuit is turned off, and the output current-control circuit does not have any influence on the operation of the output circuit.

10 Claims, 2 Drawing Sheets

BICMOS OUTPUT CIRCUIT WITH STATIC OUTPUT CURRENT CONTROL CIRCUIT

BACKGROUND OF THE INVENTION

1. Field of the Invention

The present invention relates to an output circuit for a bus driver integrated circuit and, more particularly, to a control-stage circuit of a Bi-MOS integrated circuit having both bipolar (Bi) and metal oxide semiconductor (MOS) elements.

2. Description of the Related Art

In a conventional Bi-MOS output circuit for outputting a signal of a TTL (Transistor Transistor Logic) level, a bipolar transistor in the output-stage circuit is controlled by a MOS transistor in a control-stage circuit. A typical example is shown in FIG. 1. In the control-stage circuit of this output circuit, an input terminal IN for receiving an input signal is connected to the gate of an n-channel MOS transistor M1 for phase division. The drain of the MOS transistor M1 is connected to a power source Vcc through a resistor R1. The source of the MOS transistor M1 is connected to a ground potential GND through a pull down circuit PD. In this output-stage circuit, a pull up npn transistor Q2 and a pull down Schottky barrier npn transistor Q3 are connected in a totem pole scheme between the power source Vcc and the ground potential GND. A common node between the transistors Q2 and Q3 is connected to an output terminal OUT.

A resistor R2 is connected between the collector of the pull up npn transistor Q2 and the power source Vcc, and a resistor R3 is connected in a base-emitter path of the transistor Q2. The base of the npn transistor Q3 is connected to the pull down circuit PD. A Schottky barrier npn transistor Q1 is Darlington-connected to the npn transistor Q2. The base of the npn transistor Q1 is connected to the drain of a MOS transistor M1. A first Schottky barrier diode D1 is connected between the emitter of the npn transistor Q1 and the drain of the MOS transistor M1. A second Schottky barrier diode D2 is connected between the output terminal OUT and the drain of the MOS transistor M1.

Note that the transistors Q1 and Q3 and the diodes D1 and D2 are of a Schottky barrier type, but they are not limited to this.

An operation of the output circuit having the arrangement described above will be described below. When an input signal input to the input terminal IN goes from level "1" to level "0", the MOS transistor M1 is turned off. A base current is supplied from the power source Vcc to the npn transistor Q1 through the resistor R1, so that the transistor Q1 is turned on, and at the same time, the pull up npn transistor Q2 is also turned on. Meanwhile, since the MOS transistor M1 is turned off, the base charge of the pull down npn transistor Q3 is extracted through the pull down circuit PD, so that the npn transistor Q3 is turned off. In this manner, when the npn transistor Q1 is turned on and the npn transistor Q3 is turned off, a current is supplied from the power source Vcc to the output terminal OUT through the resistor R2 and the npn transistor Q2. An output voltage at the output terminal OUT is changed from TTL level "0" to TTL level "1". In this case, since the first and second diodes D1 and D2 are kept off, this change in output level does not influence the operation of the circuit.

However, when the input signal supplied to the input terminal IN goes from CMOS level "0" to CMOS level "1", the MOS transistor M1 is turned on. A base current is supplied from the power source Vcc to the pull down npn transistor Q3 through the resistor R1 and the MOS transistor M1, and at the same time, a base current is also supplied from the output terminal OUT to the transistor Q3 through the second diode D2, so that the transistor Q3 is turned on. Meanwhile, since the MOS transistor M1 is turned on, the base charges of the npn transistors Q1 and Q2 are extracted by the MOS transistor M1, so that the npn transistors Q1 and Q2 are turned off. In this case, the base charge of the npn transistor Q2 is rapidly extracted by the first diode D1, and the transistor Q2 is quickly turned off. Potentials at both terminals of the resistor R3 are set to be equal to each other by the first and second diodes D1 and D2, and the pull up transistor Q2 is accurately turned off. Therefore, the charge at the output terminal OUT is extracted to the ground potential through the pull down npn transistor Q3, and the output voltage goes from TTL level "1" to TTL level "0".

It is desirable to increase a load drive capacity of the output circuit upon a change in output voltage of the output circuit from level "1" to level "0", i.e., a load drive capacity of the transistor Q3 so as to drive a large load circuit. For this purpose, the resistance of the resistor R1 is minimized, and the base current of the pull down npn transistor Q3 is increased in a conventional arrangement. When the resistance of the resistor R1 is decreased, a leading edge of an output waveform upon a change in output voltage of the output circuit from level "0" to level "1" becomes steep, and the rise time of the output waveform is shortened. That is, when the input signal supplied to the input terminal IN goes from CMOS level "1" to CMOS level "0" to turn off the MOS transistor M1, and when the pull up npn transistors Q1 and Q2 are turned on to change the output voltage of the output circuit from level "0" to level "1", the base potential of the pull up npn transistor Q1 is changed in accordance with a time constant determined by a parasitic base capacitance and the resistor R1 if its base current is neglected. When the resistance of the resistor R1 is reduced, a rate of change in base potential of the transistor Q1 is increased, and the rise time of the output waveform in response to the input signal is shortened. Therefore, the rise time of the output waveform is shortened.

When the resistance of the resistor R1 is decreased, the load drive capacity of the pull down npn transistor Q3 is increased upon a change in output voltage of the output circuit from level "1" to level "0", as described above. However, since the load drive capacity of the transistor Q3 is increased, a large transient current (sink current) flows from a load circuit (not shown) to the output terminal OUT upon this change in output level. When the large sink current transiently flows upon a change in output level of the output circuit (i.e., a change in output level of the integrated circuit), a large voltage drop transiently occurs in an inductance present in a lead or the like of an integrated circuit package, thereby increasing switching noise.

A sink current i of the integrated circuit is represented as follows:

$$i = C \cdot dV/dt$$

where C is the load capacitance of the integrated circuit and dV/dt is a slewing rate of the output waveform of the integrated circuit. A voltage drop ΔV caused by the transient sink current is given as follows:

$$\Delta V = L \cdot di/dt$$
$$= L \cdot C \cdot d^2V/dt^2$$

where L is the inductance existing in a lead or the like of the integrated circuit package. Switching noise corresponding to the voltage drop ΔV is generated by a transient sink current.

In the conventional Bi-CMOS output circuit, the load drive capacity of the pull down npn transistor is increased to increase a load drive capacity upon a change in output voltage of the output circuit from level "1" to level "0". For this reason, a large transient sink current flows to generate switching noise upon a change in output voltage of the output circuit from level "1" to level "0".

SUMMARY OF THE INVENTION

The present invention has been made to solve the conventional problems described above, and has as its object to provide an output circuit capable of suppressing switching noise generated by a transient sink current flowing through a pull down npn transistor upon a change in output voltage of the output circuit from level "1" to level "0" without degrading a static output-current characteristic.

In order to achieve the above object of the present invention, there is provided an output circuit comprising an input terminal for receiving an input signal; an output terminal for outputting a signal of said output circuit; a first power source potential and a second power source potential; a pull up first npn transistor and a pull down second npn transistor, which are connected in a totem pole scheme between said first and second power source potentials and whose common node is connected to said output terminal; a first resistor connected in series between said first and second power source potentials, and a first MOS transistor, having a gate connected to said input terminal, for controlling said first and second npn transistors in response to the input signal; and a static output-current control circuit, connected in parallel with said resistor and turned on by detecting that a potential at said output terminal is at a predetermined value or less.

When the input signal supplied to the input terminal IN goes from CMOS level "0" to CMOS level "1" to change the voltage at the output terminal OUT from TTL level "1" to TTL level "0", and when the potential at the output terminal becomes a predetermined value or less, the static output-current control circuit is turned on. A base current is supplied from the static output-current control circuit to the pull down npn transistor Q3 through the first MOS transistor M1. As a result, the static output current is kept constant as in a normal operation.

When a resistance of a resistor connected in series with the first MOS transistor M1 is increased to reduce a base current of the pull down transistor Q3 upon a change in output voltage of the output circuit from level "1" to level "0", the load drive capacity can be decreased. The transient sink current flowing in a path of the output terminal OUT, the pull down transistor Q3, and the ground potential GND is more suppressed than that in the conventional circuit (FIG. 1). The switching noise generated by this transient current is suppressed. In addition, the static output-current characteristic of the output circuit is not conventionally degraded by the static output-current control circuit.

To the contrary, when the input signal supplied to the input terminal goes from CMOS level "1" to MOS level "0" to change the voltage at the output terminal from TTL level "0" to TTL level "1", and the potential at the output terminal is a predetermined value or more, the output current-control circuit is turned off, and the output current-control circuit does not have any influence on the operation of the output circuit.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENT

A preferred embodiment of the present invention will be described with reference to the accompanying drawings hereinafter.

Figure 2:
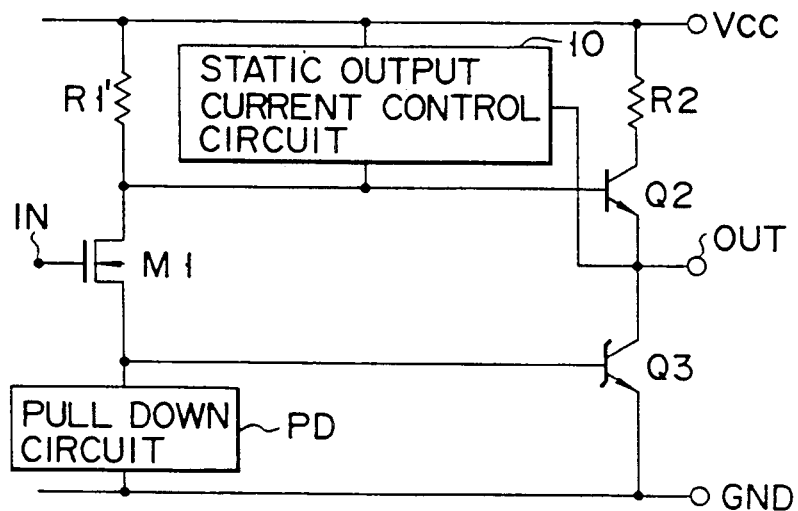
FIG. 2 is a circuit diagram showing a basic arrangement of an output circuit according to the present invention.

FIG. 2 shows a basic arrangement of an embodiment of an output circuit for a Bi-MOS semiconductor integrated circuit according to the present invention. This output circuit comprises: pull up and pull down npn transistors Q2 and Q3 which are connected like a totem pole between two power source potentials Vcc and GND and whose common node is connected to an output terminal OUT; a resistor R1' connected in series between the two power source potentials, and an n-channel first MOS transistor M1 for selectively controlling the npn transistors Q2 and Q3 in response to an input signal input to its gate; and a static output-current control circuit 10 connected in parallel with the resistor R1', and turned on by detecting that a potential at the output terminal OUT is set at a predetermined value or less. Reference numeral PD denotes a pull down circuit connected between the transistor Q3 and the power source potential GND.

An operation of the output circuit shown in FIG. 2 will be described below. When a control signal supplied to the input terminal IN goes from CMOS level "0" to CMOS level "1", the MOS transistor M1 is turned on. A base current is supplied from the power source potential Vcc to the pull down npn transistor Q3 through the resistor R1' and the MOS transistor M1, so that the npn transistor Q3 is turned on.

Meanwhile, since the MOS transistor M1 is turned on, the base charge of the pull up npn transistor Q2 is extracted by the MOS transistor M1, and the npn transistor Q2 is turned off. The charge at the output terminal OUT is extracted to the ground potential through the pull down npn transistor Q3. The output voltage at the output terminal OUT goes from TTL level "1" to TTL level "0".

When the potential at the output terminal OUT is decreased to a predetermined value or less, the static output-current control circuit 10 is turned on to supply a base current to the pull down npn transistor Q3. The static output current is not decreased and is kept constant as in a normal operation.

Figure 1:
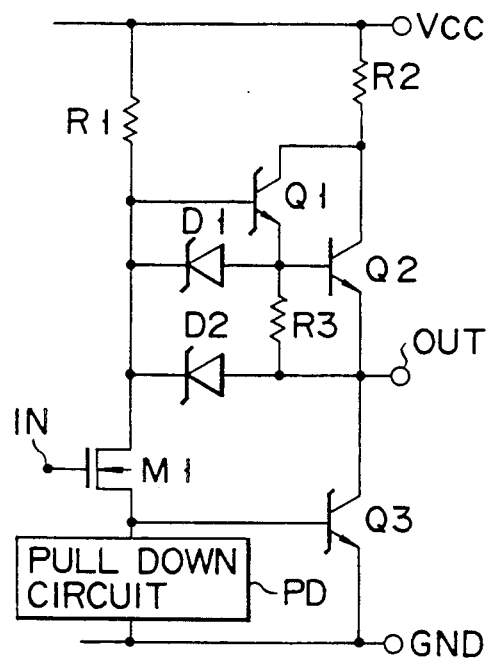
FIG. 1 is a circuit diagram showing a conventional output circuit.

In the output circuit shown in FIG. 2, the resistance of the resistor R1' connected in series with the first MOS transistor M1 is set to be larger than that in the conventional circuit (FIG. 1) to decrease the base current of the pull down transistor Q3 upon a change in output voltage of the output circuit from level "1" to level "0", thereby decreasing the load drive capacity at this time. A transient current flowing in a path of the output terminal OUT, the pull down transistor Q3, and the ground potential GND can be more suppressed than that in the conventional circuit (FIG. 1). As a result, switching noise generated by this transient current can be reduced. In addition, the static output-current characteristic of the output circuit is not degraded due to the presence of the static output-current control circuit 10, and a signal transmission delay time of the output circuit is not undesirably prolonged.

To the contrary, when the input signal supplied to the input terminal IN goes from CMOS level "1" to CMOS level "0", the MOS transistor M1 is turned off. A base current is supplied from the power source potential Vcc to the pull up npn transistor Q2 through the resistor R1', so that the npn transistor Q2 is turned on. Meanwhile, since the MOS transistor M1 is turned off, the base charge of the pull down npn transistor Q3 is extracted by a pull down circuit PD, and the transistor Q3 is turned off. In this manner, since the transistor Q2 is turned on and the transistor Q3 is turned off, a current is supplied from the power source potential Vcc to the output terminal OUT through a resistor R2 and the npn transistor Q2. The output voltage goes from TTL level "0" to TTL level "1". When the potential at the output terminal OUT is a predetermined value or more, the static output-current control circuit 10 is turned off and does not influence the operation of the output circuit.

Figure 3:
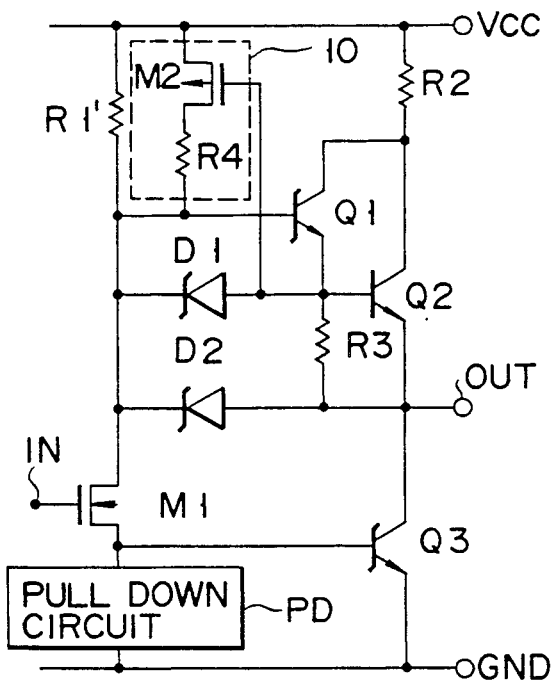
FIG. 3 is a circuit diagram showing an embodiment of the output circuit shown in FIG. 2.

FIG. 3 shows an embodiment of the output circuit having the basic arrangement shown in FIG. 2. A static output-current control circuit 10 is added to the conventional output circuit shown in FIG. 1, and other parts are the same as those in FIG. 1. The same reference numerals as in FIG. 1 denote the same parts in FIG. 3.

In the output circuit of the embodiment, an input terminal IN for receiving an input signal is connected to the gate of an n-channel MOS transistor M1 for phase division. The drain of the MOS transistor M1 is connected to a power source Vcc through a resistor R1'. The source of the MOS transistor M1 is connected to a ground potential GND through a pull down circuit PD. A pull up npn transistor Q2 and a pull down Schottky barrier npn transistor Q3 are connected in a totem pole scheme between the power source Vcc and the ground potential GND. A common node between the transistors Q2 and Q3 is connected to an output terminal OUT.

A resistor R2 is connected between the collector of the pull up npn transistor Q2 and the power source Vcc, and a resistor R3 is connected in a base-emitter path of the transistor Q2. The base of the npn transistor Q3 is connected to the pull down circuit PD. A Schottky barrier npn transistor Q1 is Darlington-connected to the npn transistor Q2. The base of the npn transistor Q1 is connected to the drain of a MOS transistor M1. A first Schottky barrier diode D1 is connected between the emitter of the npn transistor Q1 and the drain of the MOS transistor M1. A second Schottky barrier diode D2 is connected between the output terminal OUT and the drain of the MOS transistor M1.

Static output-control circuit 10 is connected in parallel with the resistor R1'.

Note that the transistors Q1 and Q3 and the diodes D1 and D2 are of a Schottky barrier type, but they are not limited to this.

The static output-current control circuit 10 comprises a p-channel second MOS transistor M2 and a resistor R4 connected in series, as shown in FIG. 3. The series circuit is connected in parallel with the resistor R1'. The gate of the transistor M2 is connected to the output terminal OUT through the resistor R3. A potential at the output terminal OUT is supplied to the gate of the MOS transistor M2 through a resistor R3.

Figure 4:
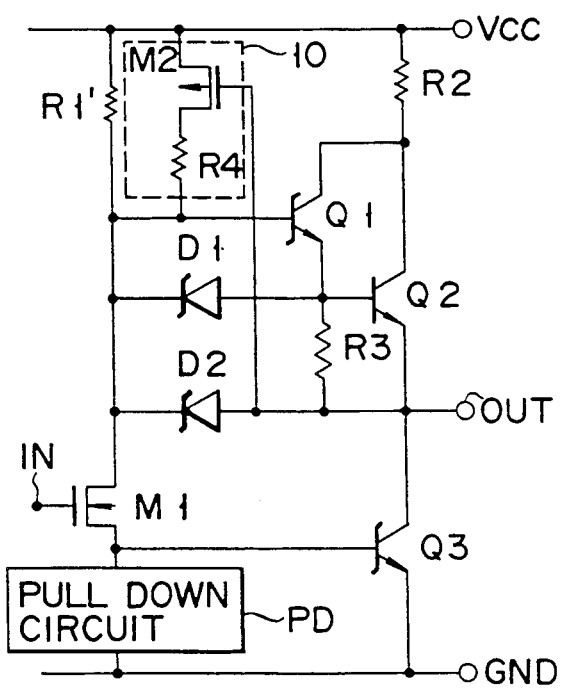
FIG. 4 is a circuit diagram showing a modification of the output circuit shown in FIG. 3.

The gate of the transistor M2 may be directly connected to the output terminal OUT without going through the resistor R3, as shown in FIG. 4.

The operation of the output circuit shown in FIG. 3 is basically the same as that of the output circuit shown in FIG. 2. The operation of the static output-current control circuit 10 will be mainly described.

When an input signal supplied to the input terminal IN goes from CMOS level "0" to CMOS level "1" to change the voltage at the output terminal OUT from TTL level "1" to TTL level "0", and when the potential at the output terminal OUT becomes a predetermined value or less, the MOS transistor M2 in the static output-current control circuit 10 is turned on, and a base current is supplied from the static output-current control circuit 10 to the pull down npn transistor Q3 through the MOS transistor M1, so that the static output current is not decreased but is kept constant as in a normal operation.

To the contrary, when the input signal supplied to the input terminal IN goes from CMOS level "1" to CMOS level "0" to change the voltage at the output terminal OUT from TTL level "0" to TTL level "1", and when the potential at the output terminal OUT becomes the predetermined value or more, the MOS transistor M2 in the static output-current control circuit 10 is turned off, and the static output-current control circuit 10 does not have any influence on the operation of the output circuit.

In the output circuit shown in FIG. 3, the peak value of the transient current flowing through the pull down transistor Q3 upon a change in output voltage from level "1" to level "0" can be reduced by 13% from that in the conventional output circuit (FIG. 1). Therefore, it is confirmed that switching noise generated upon a change in output voltage from level "1" to level "0" can be reduced.

In the output circuit according to the present invention, as described above, switching noise generated by the transient current flowing through the pull down transistor upon a change in output voltage from level "1" to level "0" can be reduced without degrading the static output-current characteristic of the output circuit.

Additional advantages and modifications will readily occur to those skilled in the art. Therefore, the invention in its broader aspects is not limited to the specific details, and representative devices, shown and described. Accordingly, various modifications may be made without departing from the spirit or scope of the general inventive concept as defined by the appended claims and their equivalents.

What is claimed is:

1. An output circuit comprising:
    an input terminal for receiving an input signal;
    an output terminal for outputting a signal of said output circuit;
    a first power source terminal for receiving a first power source potential and a second power source terminal for receiving a second power source potential;
    a pull up first bipolar transistor having a collector, an emitter, and a base; and a pull down second bipolar transistor having a collector, an emitter, and a base, said first and second bipolar transistors being connected in series between said first and second power source terminals, said emitter of said first bipolar transistor being connected to a common node, said collector of said second bipolar transistor being connected to said common node, and said output terminal being connected to said common node;
    a first resistor connected in series between said first and second power source terminals, and a first MOS transistor, having a gate connected to said input terminal, a source connected to said base of said first bipolar transistor and a drain connected to said base of said second bipolar transistor, for controlling said first and second bipolar transistors in response to the input signal; and
    a static output-current control circuit connected in parallel with said first resistor, the control circuit being turned on to flow a static output current by detecting that a potential of an output signal at said output terminal becomes a predetermined value or less when a logic level of the output signal changes from "1" level to "0" level.

2. A circuit according to claim 1, wherein said first MOS transistor has an n type conductivity channel, and said static output-current control circuit comprises a p-channel MOS transistor, a gate of which receives the potential at said output terminal, and a second resistor connected in series with said p-channel MOS transistor.

3. An output circuit according to claim 2, wherein said series circuit of said p-channel MOS transistor and said second resistor is connected directly to said output terminal.

4. An output circuit according to claim 2, further comprising a third resistor, in which said series circuit of said p-channel MOS transistor and said second resistor is connected to said output terminal via said third resistor.

5. An output circuit according to claim 1, further comprising a first diode and a second diode, said first diode being connected between the base of said pull up first bipolar transistor and said first MOS transistor, and said second diode being connected to said output terminal and said first MOS transistor.

6. An output circuit according to claim 5, wherein said first and second diode means are of Schottky barrier type.

7. An output circuit according to claim 5, further comprising a pull down circuit connected to a junction of said first MOS transistor and the base of said pull down second bipolar transistor and said pull down circuit connected to said second power source terminal.

8. An output circuit according to claim 7, further comprising a fourth resistor connected between said first power source potential and said pull up first bipolar transistor.

9. An output circuit according to claim 7, further comprising a third bipolar transistor darlington-connected to said pull up first bipolar transistor.

10. An output circuit according to claim 9, wherein said second and third bipolar transistors are of Schottky barrier type.

* * * * *

UNITED STATES PATENT AND TRADEMARK OFFICE
CERTIFICATE OF CORRECTION

PATENT NO. : 5,059,824

DATED : October 22, 1991

INVENTOR(S) : Masaji Ueno

It is certified that error appears in the above-identified patent and that said Letters Patent is hereby corrected as shown below:

Abstract, line 5, after "value" change "of" to --or--.

Abstract, line 16, change "MOS" to --CMOS--.

Signed and Sealed this

Thirteenth Day of July, 1993

Attest:

MICHAEL K. KIRK

*Attesting Officer*  Acting Commissioner of Patents and Trademarks